United States Patent
Lee et al.

(10) Patent No.: US 12,317,507 B2
(45) Date of Patent: May 27, 2025

(54) SEMICONDUCTOR MEMORY DEVICE

(71) Applicant: Samsung Electronics Co., Ltd., Suwon-si (KR)

(72) Inventors: Minjun Lee, Seoul (KR); Yongseok Kim, Suwon-si (KR); Hyuncheol Kim, Seoul (KR); Jongman Park, Hwaseong-si (KR); Dongsoo Woo, Seoul (KR); Kyunghwan Lee, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 511 days.

(21) Appl. No.: 17/868,944

(22) Filed: Jul. 20, 2022

(65) Prior Publication Data

US 2023/0115434 A1    Apr. 13, 2023

(30) Foreign Application Priority Data

Oct. 8, 2021  (KR) .......................... 10-2021-0134279

(51) Int. Cl.
*H10B 12/00* (2023.01)
*H10B 53/30* (2023.01)

(52) U.S. Cl.
CPC .................... *H10B 53/30* (2023.02)

(58) Field of Classification Search
CPC .... H10B 53/30; H10B 12/482; H10B 12/488; H10B 43/10; H10B 51/10; H10B 99/10; H10B 43/40; H10B 43/30; H10B 12/50; H10B 51/40; H10B 12/01; H10B 51/30; H10B 51/50; H10B 43/27; H10B 43/50; H10B 51/20
See application file for complete search history.

(56) References Cited

U.S. PATENT DOCUMENTS

| | | |
|---|---|---|
| 6,235,573 B1 | 5/2001 | Lee et al. |
| 7,423,300 B2 | 9/2008 | Lung et al. |
| 7,492,033 B2 | 2/2009 | Sato et al. |
| 7,800,095 B2 | 9/2010 | An et al. |
| 7,825,455 B2 | 11/2010 | Lee et al. |
| 8,525,298 B2 | 9/2013 | Yang |
| 8,729,523 B2 | 5/2014 | Pio |
| 8,824,187 B2 | 9/2014 | Park et al. |
| 9,013,911 B2 | 4/2015 | Nazarian |
| 10,573,384 B2 | 2/2020 | Liu |
| 10,784,278 B2 | 9/2020 | Huang et al. |
| 10,991,713 B2 | 4/2021 | Nagashima et al. |

(Continued)

FOREIGN PATENT DOCUMENTS

KR    100247934 B1    3/2000

*Primary Examiner* — David Vu
(74) *Attorney, Agent, or Firm* — Muir Patent Law, PLLC

(57) ABSTRACT

Disclosed is a semiconductor memory device including a substrate, a plurality of source lines extending in a first direction on the substrate, a plurality of word lines crossing the source lines and extending in a second direction different from the first direction, a plurality of bit lines crossing the source lines and the word lines and extending in a third direction different from the first direction and the second direction, and a plurality of memory cells disposed at intersections between the source lines, the word lines, and the bit lines. The first, second, and third directions are parallel to a top surface of the substrate.

20 Claims, 12 Drawing Sheets

(56) References Cited

U.S. PATENT DOCUMENTS

| | | | |
|---|---|---|---|
| 2008/0212366 A1* | 9/2008 | Ohsawa | H10B 12/20 |
| | | | 365/182 |
| 2010/0246241 A1 | 9/2010 | Seko et al. | |
| 2021/0091108 A1 | 3/2021 | Naruke et al. | |

* cited by examiner

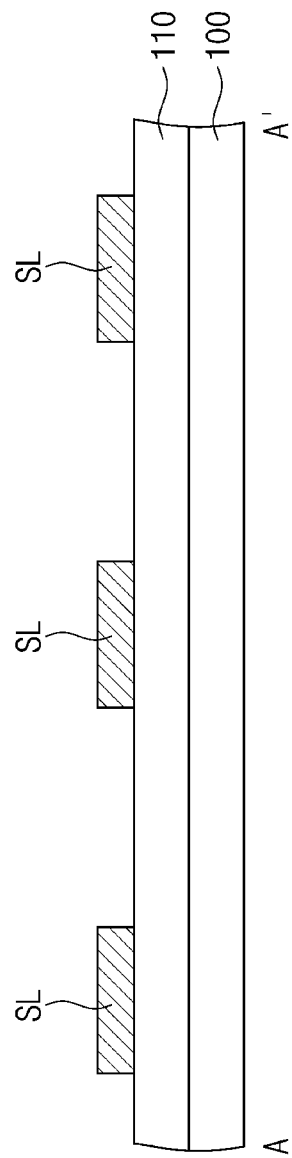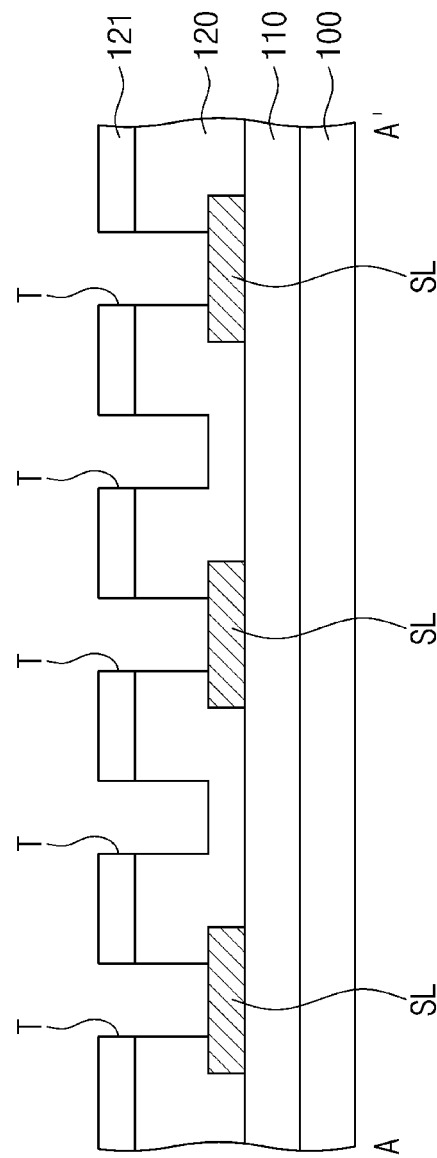

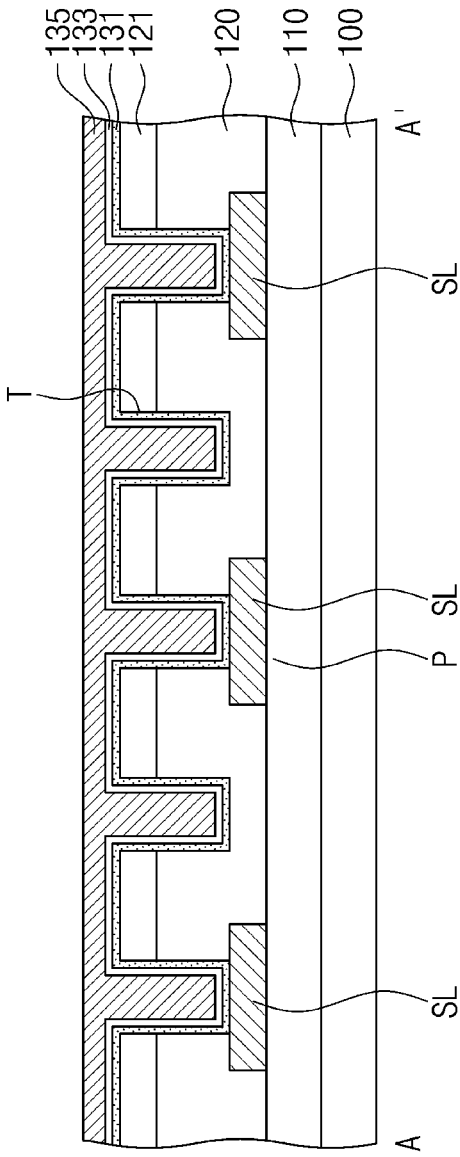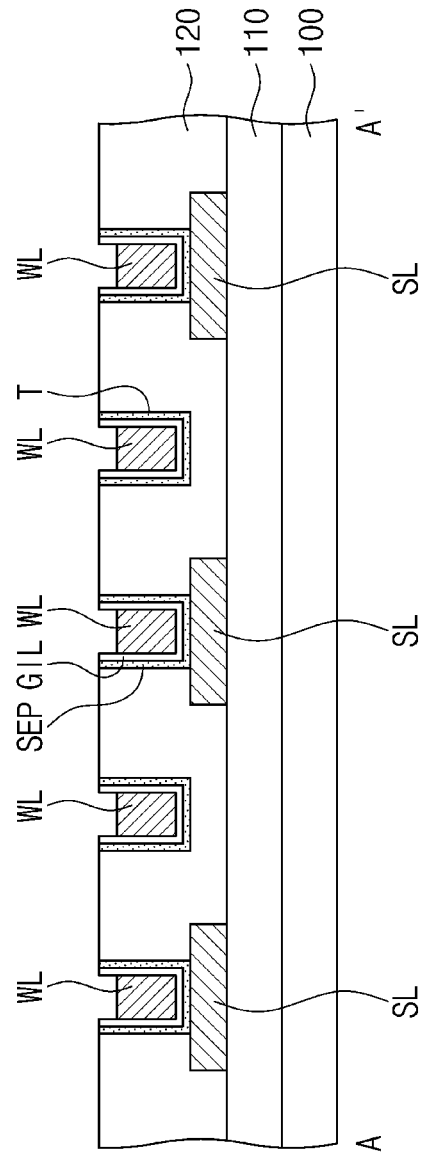

SEMICONDUCTOR MEMORY DEVICE

CROSS-REFERENCE TO RELATED APPLICATION

This U.S. nonprovisional application claims priority under 35 U.S.C § 119 to Korean Patent Application No. 10-2021-0134279 filed on Oct. 8, 2021 in the Korean Intellectual Property Office, the disclosure of which is hereby incorporated by reference in its entirety.

BACKGROUND

The present inventive concepts relate to a semiconductor memory device, and more particularly, to a semiconductor memory device whose electrical properties are improved.

A reduction in design rule of semiconductor devices causes fabrication techniques to increase integration, operating speed, and yield of semiconductor devices. Therefore, there has been suggested a transistor having a vertical channel in order to increase integration, resistance, current drive capability of the transistor. There also has been suggested a three-dimensional semiconductor memory device including three-dimensionally arranged memory cells.

SUMMARY

Some embodiments of the present inventive concepts provide a semiconductor memory device with improved electrical properties and increased integration.

Aspects of the present inventive concepts are not limited to those mentioned above, and other aspects which have not been mentioned above will be clearly understood to those skilled in the art from the following description.

According to some embodiments of the present inventive concepts, a semiconductor memory device may include a substrate; a plurality of source lines extending in a first direction on the substrate; a plurality of word lines crossing the source lines and extending in a second direction different from the first direction; a plurality of bit lines crossing the source lines and the word lines and extending in a third direction different from the first direction and the second direction; and a plurality of memory cells disposed at intersections between the source lines, the word lines, and the bit lines. The first, second, and third directions may be parallel to a top surface of the substrate.

According to some embodiments of the present inventive concepts, a semiconductor memory device may include a substrate; a plurality of source lines extending in a first direction on the substrate; a plurality of word lines crossing the source lines and extending in a second direction different from the first direction; a plurality of bit lines crossing the source lines and the word lines and extending in a third direction different from the first direction and the second direction; and a plurality of memory cells disposed at intersections between the source lines, the word lines, and the bit lines. Each of the memory cells may include a semiconductor pattern including a source region, a drain region, and a channel region between the source region and the drain region. The first, second, and third directions may be parallel to a top surface of the substrate. The channel region of the semiconductor pattern may extend in a fourth direction perpendicular to the top surface of the substrate.

According to some embodiments of the present inventive concepts, a semiconductor memory device may include a substrate; a source line extending in a first direction on the substrate; an interlayer dielectric layer having a trench that extends in a second direction crossing the source line, the second direction being different from the first direction; a semiconductor pattern disposed in the trench, the semiconductor pattern defining a gap region; a word line disposed in the gap region of the semiconductor pattern; a gate dielectric pattern disposed between the word line and the semiconductor pattern; and a bit line disposed on the interlayer dielectric layer, the bit line extending in a third direction different from the second direction. The bit line may be vertically spaced apart from the word line and may be in contact with the semiconductor pattern.

Details of other embodiments are included in the description and drawings.

BRIEF DESCRIPTION OF THE DRAWINGS

FIGS. 11 to 14 illustrate cross-sectional views taken along line A-A' of FIG. 5, showing a method of fabricating a semiconductor memory device according to some embodiments of the present inventive concepts.

DETAIL PARTED DESCRIPTION OF EMBODIMENTS

It will be hereinafter discussed a semiconductor memory device and a method of fabricating the same according to some embodiments of the present inventive concepts in conjunction with the accompanying drawings.

Figure 1:
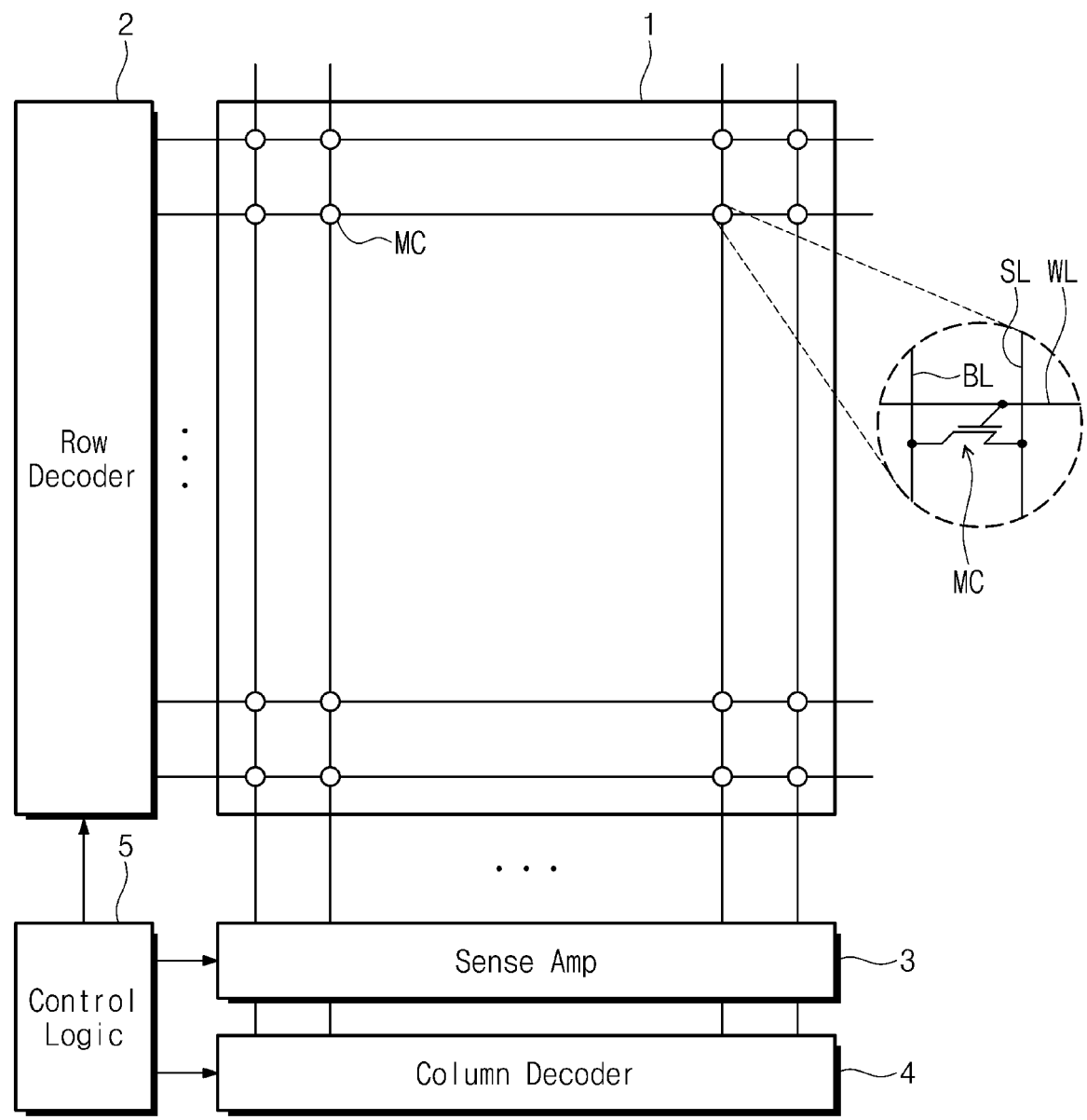
FIG. 1 illustrates a block diagram showing a semiconductor memory device according to some embodiments of the present inventive concepts.

FIG. 1 illustrates a block diagram showing a semiconductor memory device according to some embodiments of the present inventive concepts.

Referring to FIG. 1, a semiconductor memory device may include a memory cell array 1, a row decoder 2, a sense amplifier 3, a column decoder 4, and a control logic 5.

The memory cell array 1 may include a plurality of memory cells MC that are arranged three-dimensionally. Each of the memory cells MC may be formed of one transistor including a memory layer. Each of the memory cells MC may be connected to one word line WL, one bit line BL, and one source line SL.

Each of the memory cells MC may include a ferroelectric field effect transistor (FeFET), a capacitorless 1-transistor dynamic random access memory (capacitorless 1T-DRAM), or a trap random access memory (trap RAM).

The row decoder 2 may decode an address that is externally input, and may select one of the word lines WL of the memory cell array 1. The address that is decoded in the row decoder 2 may be provided to a row driver (not shown), and in response to a control operation of control circuits, the row driver may provide a certain voltage to a selected word line WL and each of non-selected word lines WL.

In response to an address that is decoded from the column decoder 4, the sense amplifier 3 may detect and amplify a voltage difference between a selected bit line BL and a reference bit line, and may then output the amplified voltage difference.

The column decoder 4 may provide a data delivery path between the sense amplifier 3 and an external device (e.g., a memory controller). The column decoder 4 may decode an address that is externally input and may select one of the bit lines BL.

The control logic 5 may generate control signals that control operations to write data to the memory cell array 1 and/or to read data from the memory cell array 1.

Figure 2:
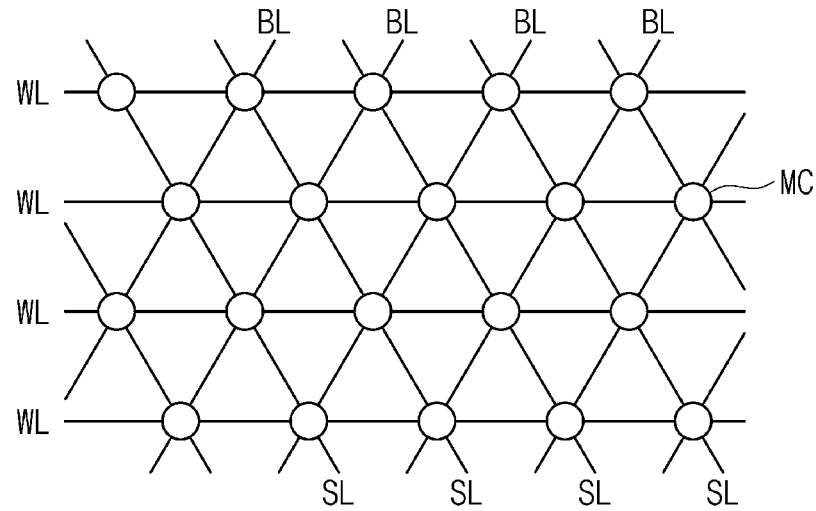
FIGS. 2 and 3 illustrate simplified circuit diagrams showing a memory cell array of a semiconductor memory device according to some embodiments of the present inventive concepts.
Figure 3:
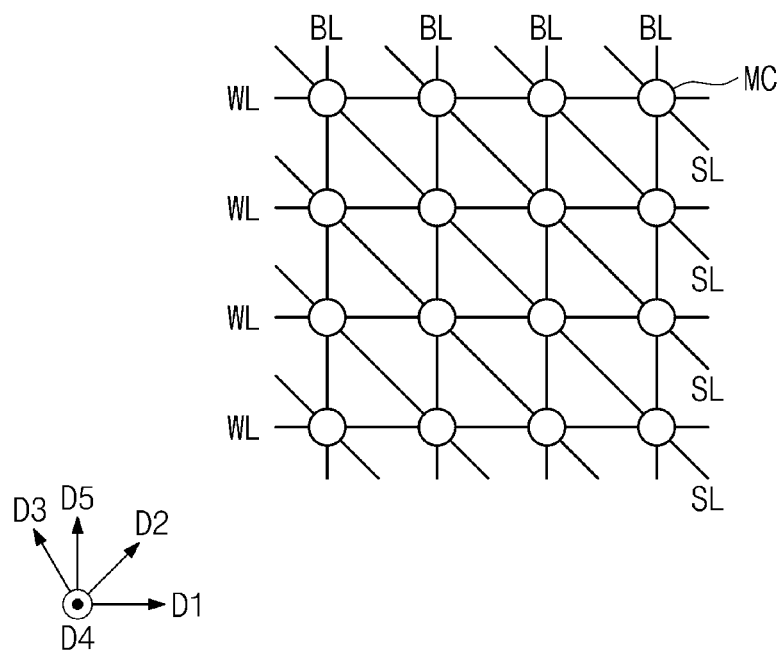

FIGS. 2 and 3 illustrate simplified circuit diagrams showing a memory cell array of a semiconductor memory device according to some embodiments of the present inventive concepts.

Referring to FIG. 2, a memory cell array may include a plurality of two-dimensionally arranged memory cells MC, source lines SL, word lines WL, and bit lines BL.

The word lines WL may extend in a first direction D1. The bit lines BL may extend in a second direction D2 and cross the word lines WL. The second direction D2 may be different from the first direction D1, and the first direction D1 may not be orthogonal to the second direction D2. The second direction D2 may be an oblique direction relative to the first direction D1, and the second direction D2 and the first direction D1 may intersect at an angle of about 30 degrees to about 70 degrees. As used herein, the term "extend" refers to occupying a space in a linear direction. For example, with respect to the source lines SL, word lines WL, and bit lines BL, the linear direction may be a direction extending lengthwise. The source lines SL, word lines WL, and bit lines BL have a length in a particular direction and a width perpendicular to that direction, where the length is greater than the width.

The source lines SL may extend in a third direction D3 and cross the bit lines BL and the word lines WL. The third direction D3 may be different from the first and second directions D1 and D2, and may not be orthogonal to any of the first and second directions D1 and D2. The third direction D3 may be an oblique direction relative to the first and second directions D1 and D2, and the third direction D3 and the second direction D2 may intersect at an angle of about 30 degrees to about 70 degrees.

According to the embodiment shown in FIG. 3, the bit lines BL may extend in a fifth direction D5 orthogonal to the first direction D1, and the source lines SL may extend in the third direction D3 oblique to the first and fifth directions D1 and D5. The third direction D3 and the fifth direction D5 may intersect at an angle of about 30 degrees to about 70 degrees.

According to some embodiments, the two-dimensionally arranged memory cells MC may be stacked in a fourth direction D4. The fourth direction D4 may be perpendicular to the first, second, third, and fifth directions D1, D2, D3, and D5.

The memory cells MC may be provided at intersections between the word lines WL and the bit lines BL and between the source lines SL. Each memory cell MC may be connected to one of the word lines WL, one of the bit lines BL, and one of the source lines SL.

One word line WL may be shared by the memory cells MC that are arranged along the first direction D1. The memory cells MC that share the same word line WL may be connected to the bit lines BL that are different from each other and to the source lines SL that are different from each other. One bit line BL may be shared by the memory cells MC that are arranged along the second direction D2. Alternatively, as illustrated in FIG. 3, one bit line BL may be shared by the memory cells MC that are arranged along the fifth direction D5 as illustrated in FIG. 3. One source line SL may be shared by the memory cells MC that are arranged along the third direction D3.

According to some embodiments, the memory cells MC may include, for example, a ferroelectric field effect transistor (FeFET). In this case, the memory cells MC may include a ferroelectric layer, and a polarization state of the ferroelectric layer may be changed based on an electric field applied to the ferroelectric layer during a program operation. The ferroelectric layer may maintain its polarization state even if power is interrupted, and thus a semiconductor memory device may act as a nonvolatile memory device.

When each memory cell MC includes a ferroelectric field effect transistor (FeFET), a gate electrode may be supplied through the word line WL with a first voltage, and drain and source terminals may be supplied through the bit line BL and the source line SL with a second voltage greater than the first voltage, with the result that a polarization of the ferroelectric layer may be set into a first polarization state. Therefore, the first polarization state (positive threshold voltage) may be stored in a memory layer. A difference between the first voltage and the second voltage may be equal to or greater than a minimum voltage difference required for setting a polarization of the ferroelectric layer into the first polarization state.

A gate electrode may be supplied through the word line WL with a third voltage, and drain and source terminals may be supplied through the bit line BL and the source line SL with a fourth voltage less than the third voltage, with the result that a polarization of the ferroelectric layer may be set into a second polarization state. Therefore, the second polarization state (negative threshold voltage) may be stored in a memory layer. A difference between the third voltage and the fourth voltage may be equal to or greater than a minimum voltage difference required for setting a polarization of the ferroelectric layer into the second polarization state.

Alternatively, the memory cells MC may be memory cells of a capacitorless 1-transistor dynamic random access memory (capacitorless 1T-DRAM), or a dynamic random access memory (DRAM) in which only a transistor is used to store data without using a capacitor.

A 1T-DRAM memory cell may include a metal oxide semiconductor (MOS) transistor including a floating body and a gate electrode that controls the floating body. Based on voltage applied to the gate electrode, charges may be accumulated in or removed from the floating body and thus data may be stored in or read from the memory cell MC.

Alternatively, the memory cells MC may be memory cells of a random access memory (RAM) including a trap layer. In this case, the trap layer may include at least one selected from a silicon nitride layer, a silicon oxynitride layer, a silicon-rich nitride layer, a nano-crystalline silicon layer, and a laminated trap layer. Alternatively, the trap layer may include a floating gate.

The memory cells MC of the trap RAM may include a semiconductor layer, a gate electrode, and a trap layer between the semiconductor layer and the gate electrode, and data may be stored in or read from the trap layer based on voltage applied to the gate electrode.

Figure 4A:
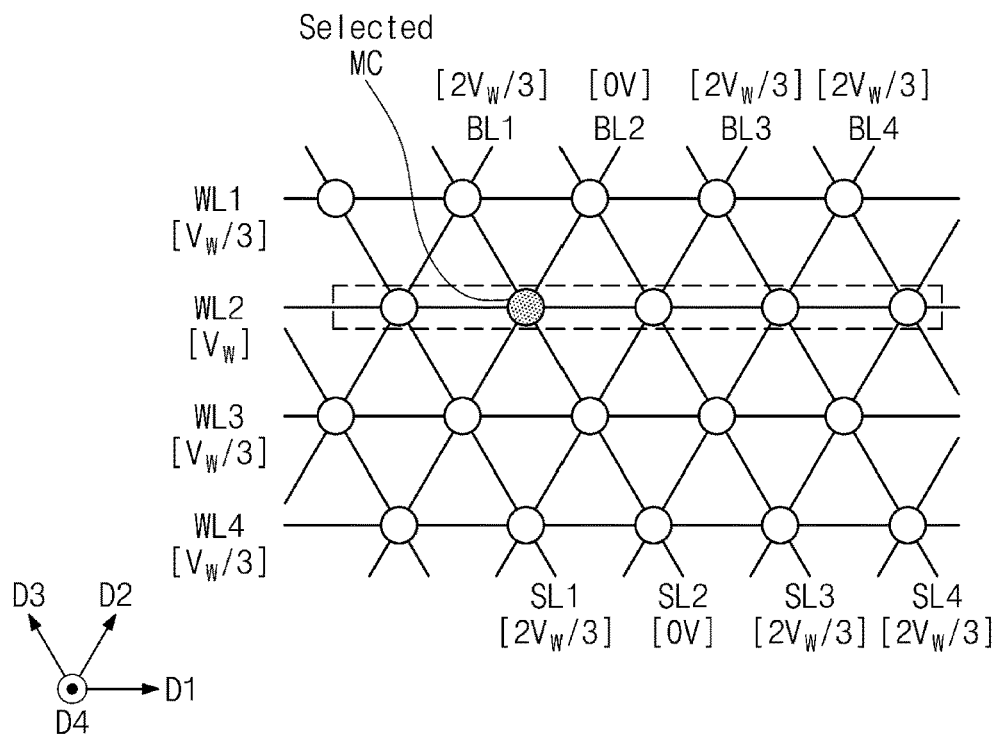
FIGS. 4A and 4B illustrate diagrams showing an operation of memory cell array in a semiconductor memory device according to some embodiments of the present inventive concepts.
Figure 4B:
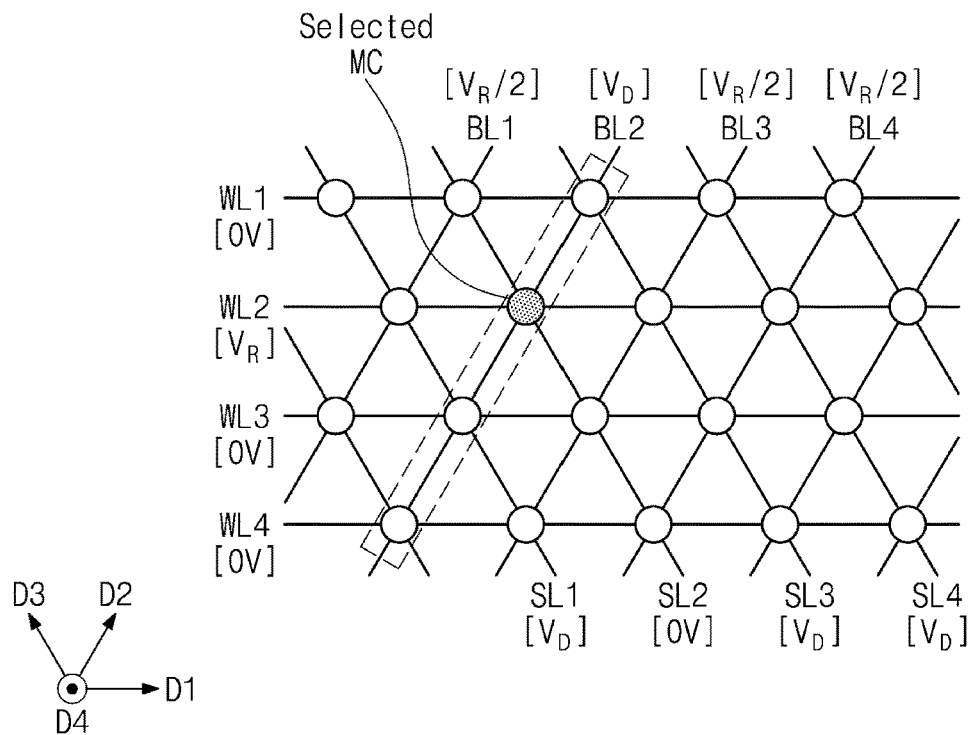

With reference to FIGS. 4A and 4B, the following will describe in detail an operation of memory cell array in a semiconductor memory device according to some embodiments of the present inventive concepts.

FIG. 4A illustrates a diagram showing a write operation of a semiconductor memory device according to some embodiments of the present inventive concepts.

Referring to FIG. 4A, one word line (e.g., WL2), one bit line (e.g., BL2), and one source line (e.g., SL2) may be chosen to select one of a plurality of memory cells MC.

For example, a first word line voltage ($V_W$) may be applied to the selected word line WL2, a first bit line voltage (0V) may be applied to the selected bit line BL2, and a first source line voltage (0V) may be applied to the selected source line SL2. For example, the first word line voltage ($V_W$) may be about 0.5 V to about 1.5 V when logic "1" is written, or about-1.0 V to about-3.0 V when logic "0" is written. The first bit line voltage and the first source line voltage may be a ground voltage.

A voltage difference may occur in a selected memory cell (selected MC) under the voltage condition mentioned above, and thus data of logic "1" or "0" may be written to the selected memory cell (selected MC).

A second write voltage ($V_W/3$) may be applied to unselected word lines WL1, WL3, and WL4, and a second bit line voltage ($2V_W/3$) may be applied to unselected bit lines BL1, BL3, and BL4. A second source line voltage ($2V_W/3$) may be applied to unselected source lines SL1, SL3, and SL4. The second write voltage ($V_W/3$) may be set to about ⅓ of a first write voltage ($V_W$), and the second bit line voltage ($2V_W/3$) and the second source line voltage ($2V_W/3$) may be set to about ⅓ of twice the first write voltage ($V_W$).

Regarding the unselected memory cells MC, the voltage condition mentioned above may cause a size of voltage disturbance to become reduced to about ⅓ of the first write voltage ($V_W$), or reduced to an absolute value of $V_W/3$. For example, a size of $V_W/3$ may be given to voltage disturbance of the memory cells MC connected between the selected word line WL2 and the unselected bit lines BL1, BL3, and BL4. The size of $V_W/3$ may also be given to voltage disturbance of the memory cells MC connected between the selected bit line BL2 and the unselected source lines SL1, SL3, and SL4. In addition, a size of $-V_W/3$ may be given to voltage disturbance of the memory cells MC connected between the unselected word lines WL1, WL3, and WL4 and the unselected bit lines BL1, BL3, and BL4.

According to some embodiments, because the memory cells MC that share the same word line WL are connected to the bit lines BL that are different from each other and to the source lines SL that are different from each other, write disturbance may be prevented in a write operation.

FIG. 4B illustrates a diagram showing a read operation of a semiconductor memory device according to some embodiments of the present inventive concepts.

Referring to FIG. 4B, to read data from the selected memory cell MC, a third word line voltage ($V_R$) may be applied to the selected word line WL2, and a third bit line voltage ($V_D$) may be applied to the selected bit line BL2. In addition, a third source line voltage (0V) may be applied to the selected source line SL2. The third word line voltage ($V_R$) may be less than the first word line voltage ($V_W$), and the third bit line voltage ($V_D$) may be the same as or less than the third word line voltage ($V_R$). The third source line voltage (0V) may be a ground voltage.

Data written in the selected memory cell MC may be read by using the selected bit line BL2 to measure a current that flows through the selected memory cell MC under the voltage condition mentioned above.

A fourth word line voltage (0V) may be applied to the unselected word lines WL1, WL3, and WL4, and a fourth bit line voltage ($V_R/2$) may be applied to the unselected bit lines BL1, BL3, and BL4. In addition, a fourth source line voltage ($V_D$) may be applied to the unselected source lines SL1, SL3, and SL4. The fourth word line voltage (0V) may be a ground voltage, and the third bit line voltage ($V_R/2$) may be about half of the third word line voltage ($V_R$). The fourth source line voltage ($V_D$) may be the same as the third bit line voltage ($V_D$).

A size of voltage disturbance of the unselected memory cells MC under the voltage condition mentioned above may be $V_R/2$ between the selected word line WL2 and the unselected bit lines BL1, BL3, and BL4. A size of $-V_D$ may be given to voltage disturbance of the memory cells MC connected between the selected bit line BL2 and the unselected source lines SL1, SL3, and SL4. In addition, a size of $-V_R/2$ may be given to voltage disturbance of the memory cells MC connected between the unselected word lines WL1, WL3, and WL4 and the unselected bit lines BL1, BL3, and BL4.

According to some embodiments, because a selected bit line BL is not parallel to any of a selected word line WL and a selected source line SL, it may be possible to minimize leakage current that flows through the selected bit line BL in a read operation of a semiconductor memory device.

Figure 5:
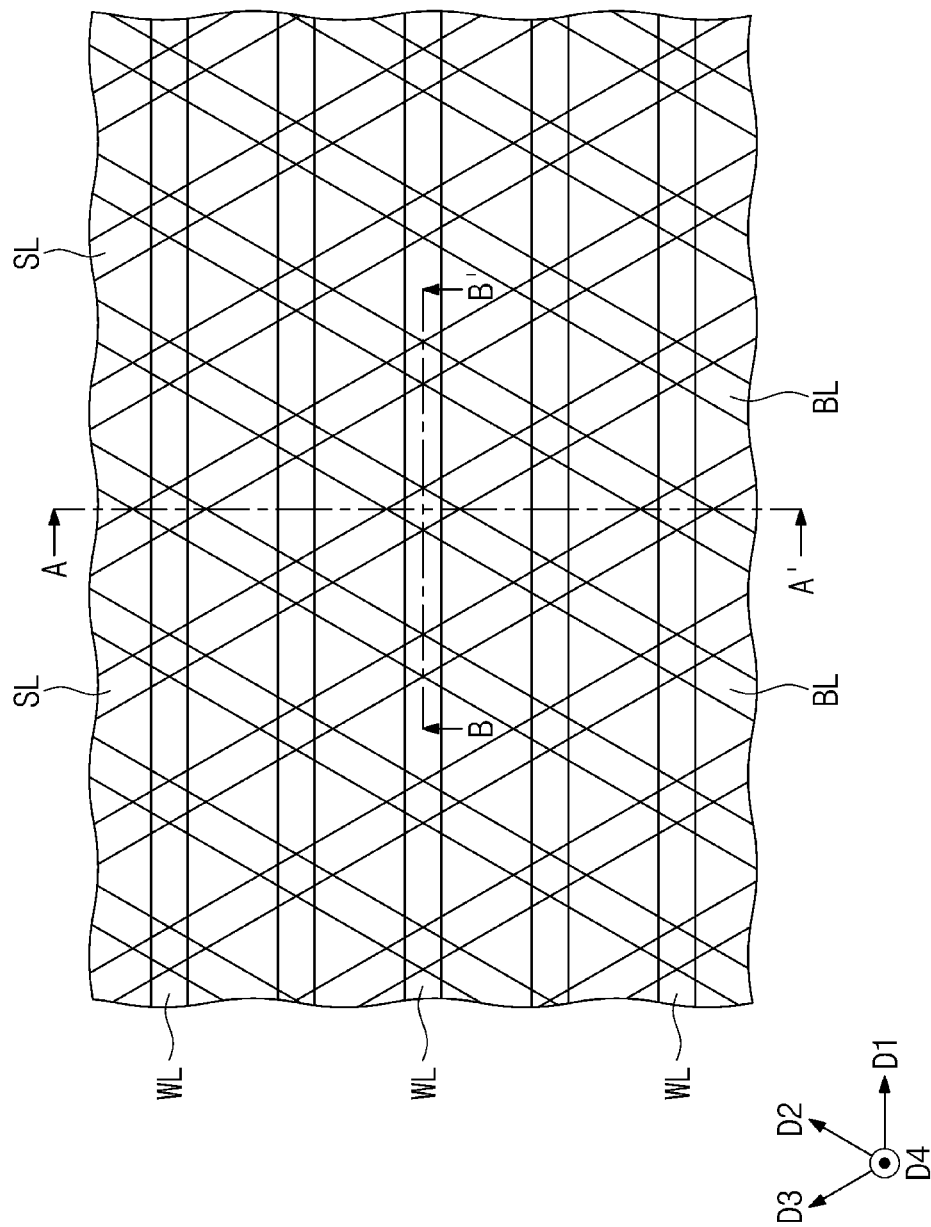
FIG. 5 illustrates a plan view showing a semiconductor memory device according to some embodiments of the present inventive concepts.
Figure 6A:
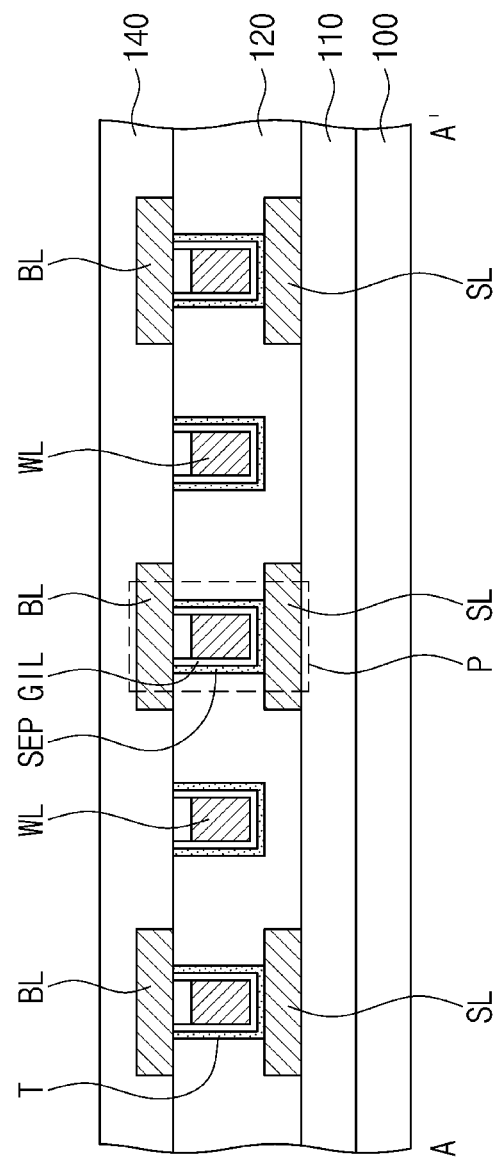
FIGS. 6A and 6B illustrate cross-sectional views respectively taken along lines A-A' and B-B' of FIG. 5, showing a semiconductor memory device according to some embodiments of the present inventive concepts.
Figure 6B:
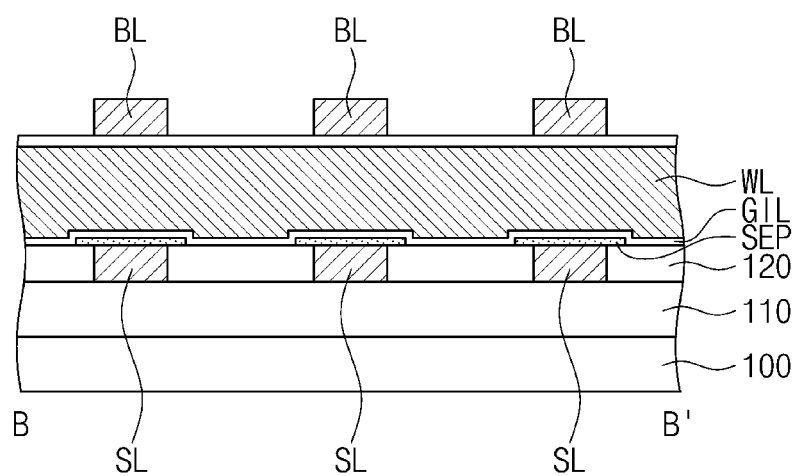
Figure 7A:
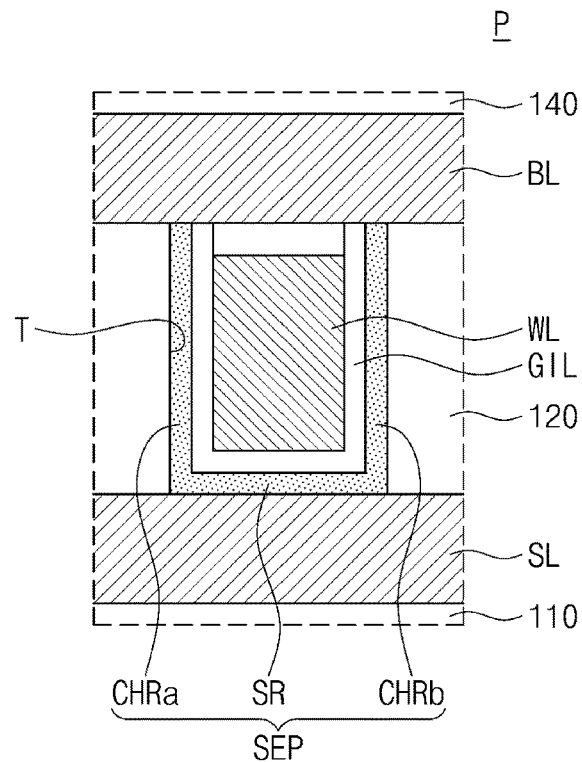
FIGS. 7A and 7B illustrate enlarged views showing section P of FIG. 6A.
Figure 7B:
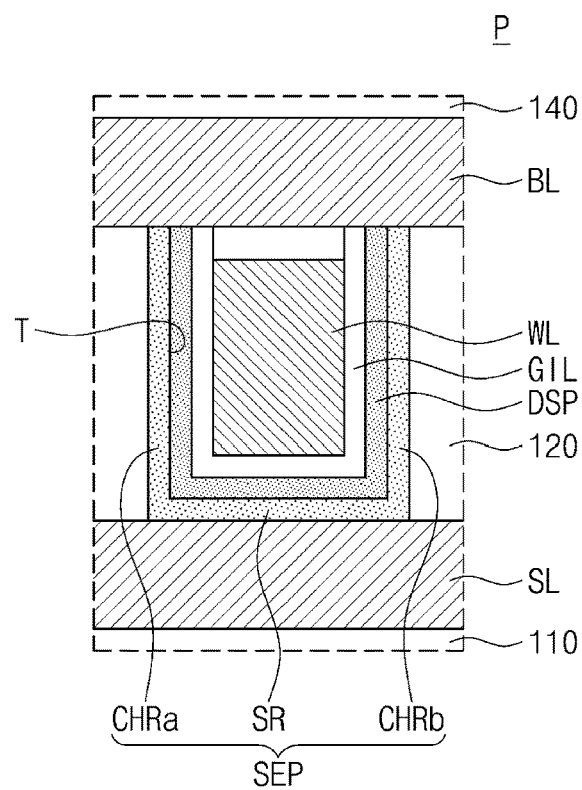

FIG. 5 illustrates a plan view showing a semiconductor memory device according to some embodiments of the present inventive concepts. FIGS. 6A and 6B illustrate cross-sectional views respectively taken along lines A-A' and B-B' of FIG. 5, showing a semiconductor memory device according to some embodiments of the present inventive concepts. FIGS. 7A and 7B illustrate enlarged views showing section P of FIG. 6A. Referring to FIGS. 5, 6A, and 6B, a lower dielectric layer 110 may be disposed on a substrate 100, and source lines SL may be disposed on the lower dielectric layer 110.

The substrate 100 may include a semiconductor substrate including a semiconductor material. For example, the semiconductor substrate may be a silicon substrate, a germanium substrate, or a silicon-germanium substrate.

The lower dielectric layer 110 may include or may be formed of, for example, one or more of a silicon oxide layer, a silicon nitride layer, a silicon oxynitride layer, and a high-k dielectric layer. The lower dielectric layer 110 may include a plurality of stacked dielectric layers.

The source lines SL may extend in a third direction D3 on the lower dielectric layer 110 and may be spaced apart from each other in a second direction D2. The second and third directions D2 and D3 may be parallel to a top surface of the substrate 100.

The source lines SL may include or may be formed of, for example, doped polysilicon, metal, conductive metal nitride, conductive metal silicide, conductive metal oxide, or any combination thereof. The source lines SL may be formed of Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, IrOx, RuOx, or any combination thereof, but the present inventive concepts are not limited thereto. The source lines SL may include a single or multiple layer formed of one or more of the materials discussed above.

A first interlayer dielectric layer 120 may be disposed on the source lines SL, and the first interlayer dielectric layer 120 may have trenches T that are spaced apart from each other in the fifth direction D5 and extend in a first direction D1. The trenches T may cross the source lines SL. The first interlayer dielectric layer 120 may include or may be formed of, for example, one or more of a silicon oxide layer, a silicon nitride layer, a silicon oxynitride layer, and a low-k dielectric layer.

Semiconductor patterns SEP may be disposed in each of the trenches T of the first interlayer dielectric layer 120. The semiconductor patterns SEP may be spaced apart from each other in the first direction D1 in each of the trenches T. The semiconductor patterns SEP may be in contact with the source lines SL.

The semiconductor patterns SEP may include a polycrystalline semiconductor material. The semiconductor patterns SEP may include one or more of silicon (Si), germanium (Ge), and silicon-germanium (SiGe). In some embodiments, the semiconductor patterns SEP may be formed of polycrystalline silicon. Alternatively, the semiconductor patterns SEP may include or may be formed of an oxide semiconductor such as indium gallium zinc oxide (IGZO), indium tungsten oxide (IWO), zinc oxide (ZnO), indium tin zinc oxide (ITZO), and BaSnO or a two-dimensional material such as $MoS_2$ and $WSe_2$.

Referring to FIGS. 7A and 7B, each of the semiconductor patterns SEP may include a horizontal part SR disposed on the source line SL, and may also include vertical parts CHRa and CHRb that vertically protrude from opposite sides of the horizontal part SR and are in contact with sidewalls of the trench T. The vertical parts CHRa and CHRb of the semiconductor patterns SEP may be perpendicular to the top surface of the substrate 100, and the horizontal parts SR of the semiconductor patterns SEP may be parallel to the top surface of the substrate 100. The vertical parts CHRa and CHRb of the semiconductor patterns SEP may be spaced apart from each other such that a gap region may be formed between the vertical parts CHRa and CHRb. For example, side boundaries of the gap region may be defined by the vertical parts CHRa and CHRb and a bottom boundary may be defined by the horizontal part SR. The semiconductor patterns SEP may each have a substantially uniform thickness at the horizontal part SR and the vertical parts CHRa and CHRb.

The horizontal part SR of each semiconductor pattern SEP may include a source region, and the vertical parts CHRa and CHRb of each semiconductor pattern SEP may include a drain region and a channel region. The channel region may be provided between the source region and the drain region, and may be adjacent to word lines WL which will be discussed below.

The word lines WL may be provided on the semiconductor patterns SEP. The word lines WL may cross the source lines SL and extend in the first direction D1. The first direction D1 may be parallel to the top surface of the substrate 100 and may be different from the third direction D3. For example, the first direction D1 may be an oblique direction relative to the third direction D3. The word lines WL may have their opposite sidewalls adjacent to and facing the vertical parts CHRa and CHRb of the semiconductor patterns SEP. The word lines WL may have their bottom surfaces adjacent to and facing the horizontal parts SR of the semiconductor patterns SEP. The word lines WL may have their top surfaces located at a level lower than that of top surfaces of the vertical parts CHRa and CHRb of the semiconductor patterns SEP. At the vertical parts CHRa and CHRb of each semiconductor pattern SEP, the channel regions may be controlled in common by the word line WL.

The word lines WL may include or may be formed of, for example, doped polysilicon, metal, conductive metal nitride, conductive metal silicide, conductive metal oxide, or any combination thereof. The word lines WL may be formed of Al, Cu, Ti, Ta, Ru, W, Mo, Pt, Ni, Co, TiN, TaN, WN, NON, TiAl, TiAlN, TiSi, TiSiN, TaSi, TaSiN, RuTiN, NiSi, CoSi, IrOx, RuOx, or any combination thereof, but the present inventive concepts are not limited thereto. The word lines WL may include a single or multiple layer formed of one or more of the materials discussed above. In some embodiments, the word lines WL may include a two-dimensional or three-dimensional material, such as graphene as a carbon-based two-dimensional material, carbon nano-tube as a three-dimensional material, or any combination thereof.

A gate dielectric pattern GIL may be interposed between the semiconductor patterns SEP and the opposite sidewalls and the bottom surface of each word line WL.

Referring to FIGS. 7A and 7B, the gate dielectric pattern GIL may be in contact with the opposite sidewalls and the bottom surface of each word line WL. The gate dielectric pattern GIL may extend in the first direction D1 parallel to the word lines WL and may conformally cover the semiconductor patterns SEP. It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present at the point of contact.

The gate dielectric pattern GIL may be formed of a silicon oxide layer, a silicon oxynitride layer, a high-k dielectric layer whose dielectric constant is greater than that of a silicon oxide layer, or any combination thereof. The high-k dielectric layer may be formed of metal oxide or metal oxynitride. For example, the high-k dielectric layer possibly used as the gate dielectric pattern GIL may be formed of $HfO_2$, $HfSiO$, $HfSiON$, $HfTaO$, $HTIO$, $HfZrO$, $ZrO_2$, $Al_2O_3$, or any combination thereof, but the present inventive concepts are not limited thereto.

According to the embodiment shown in FIG. 7B, a data storage pattern DSP may be disposed between the gate dielectric pattern GIL and the semiconductor pattern SEP. Likewise the semiconductor pattern SEP, the data storage pattern DSP may include a horizontal part parallel to the top surface of the substrate 100 and may also include vertical parts that penetrate from opposite sides of the horizontal part in a direction perpendicular to the top surface of the substrate 100.

For example, the data storage pattern DSP may include a ferroelectric material having polarization properties caused by electric field applied thereto. The ferroelectric material may be formed of a dielectric material including hafnium. The ferroelectric material may include or may be formed of, for example, $HfO_2$, $HfSiO_2$ (Si-doped $HfO_2$), $HfAlO_2$ (Al-doped $HfO_2$), $HfSiON$, $HfZnO$, $HfZrO_2$, $ZrO_2$, $ZrSiO_2$, $HfZrSiO_2$, $ZrSiON$, $LaAlO$, $HfDyO_2$, or $HfScO_2$.

Alternatively, the data storage pattern DSP may include a trap layer capable of storing charges. The trap layer may include or may be formed of, for example, at least one selected from a silicon nitride layer, a silicon oxynitride layer, a silicon-rich nitride layer, a nano-crystalline silicon layer, and a laminated trap layer. Alternatively, the trap layer may include a floating gate.

The bit lines BL may be provided on the first interlayer dielectric layer 120. The bit lines BL may extend in the second direction D2 and cross the word lines WL. The second direction D2 may be parallel to the top surface of the substrate 100 and may be different from the first direction D1 and the third direction D3. For example, the second direction D2 may be an oblique direction relative to the first direction D1 and the third direction D3. Alternatively, as illustrated in FIG. 3, the bit lines BL may extend in the fifth direction D5 and cross the word lines WL. The fifth direction D5 may be parallel to the top surface of the substrate 100 and may be different from the first direction D1, second direction D2, and the third direction D3. For example, the fifth direction D5 may be an oblique direction relative to the second direction D2 and the third direction D3, and the fifth direction D5 may be an orthogonal direction relative to the first direction D1.

The bit lines BL may be vertically spaced apart (i.e., in the fourth direction D4) from the word lines WL, and may be in contact with the semiconductor patterns SEP that are arranged along the second direction D2. The bit line BL may be in common contact with the vertical parts CHRa and CHRb of each semiconductor pattern SEP.

The bit lines BL may include or may be formed, for example, doped polysilicon, metal, conductive metal nitride, conductive metal silicide, conductive metal oxide, or any combination thereof. The bit lines BL may be formed of, for example, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, IrOx, RuOx, or any combination thereof, but the present inventive concepts are not limited thereto. The bit lines BL may include a single or multiple layer formed of one or more of the materials discussed above. In some embodiments, the bit lines BL may include a two-dimensional or three-dimensional material, such as graphene as a carbon-based two-dimensional material, carbon nano-tube as a three-dimensional material, or any combination thereof.

The first interlayer dielectric layer 120 may be provided thereon with a second interlayer dielectric layer 140 that covers the bit lines BL.

Figure 8:
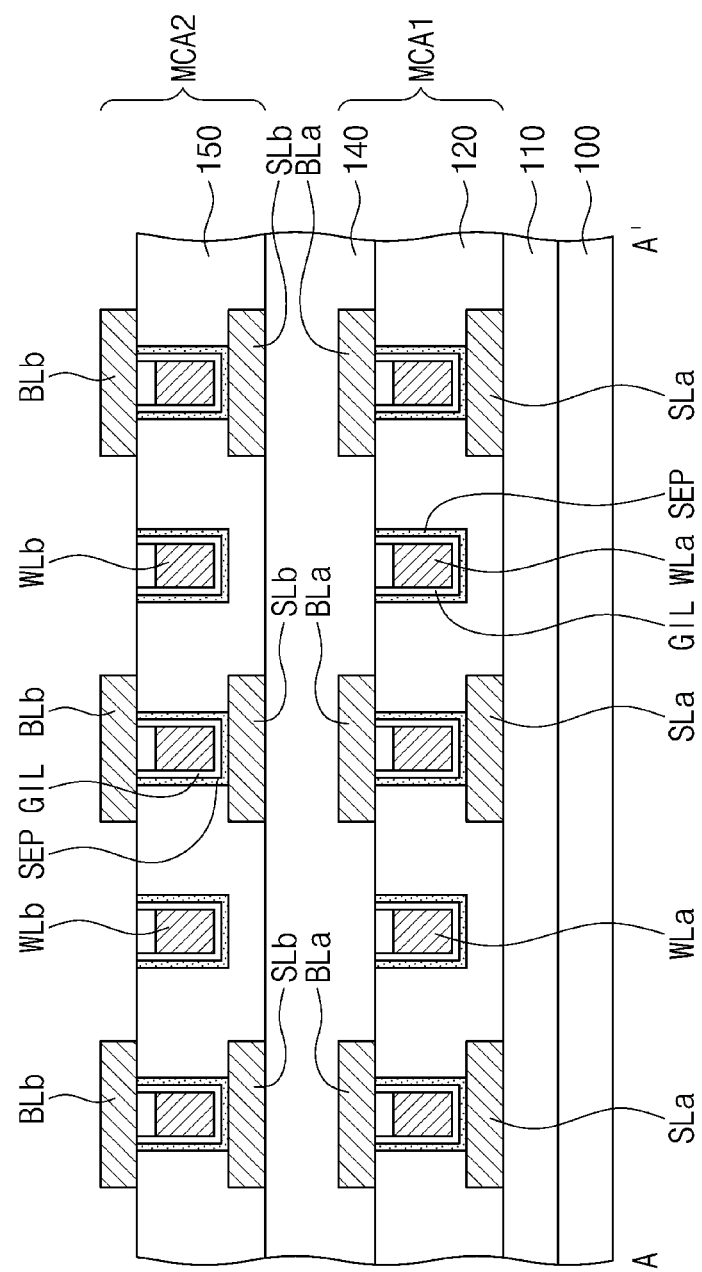
FIGS. 8, 9, and 10 illustrate cross-sectional views taken along line A-A' of FIG. 5, showing a semiconductor memory device according to some embodiments of the present inventive concepts.
Figure 9:
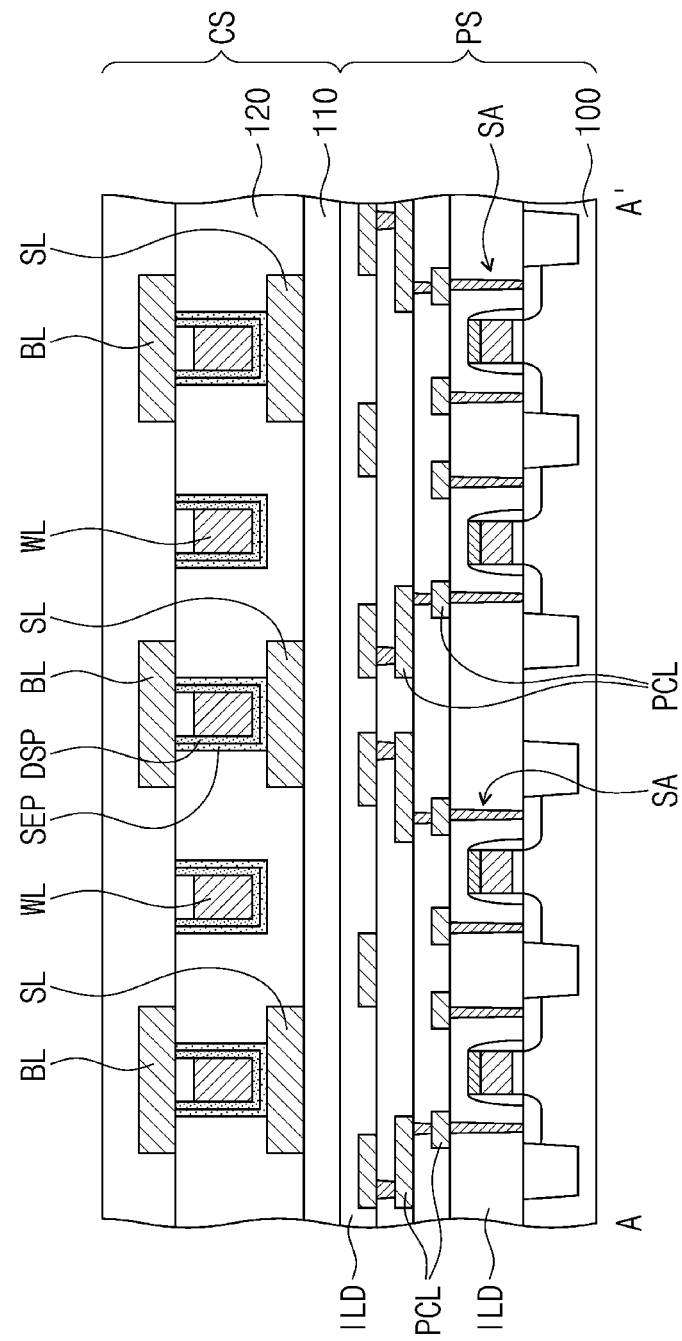
Figure 10:
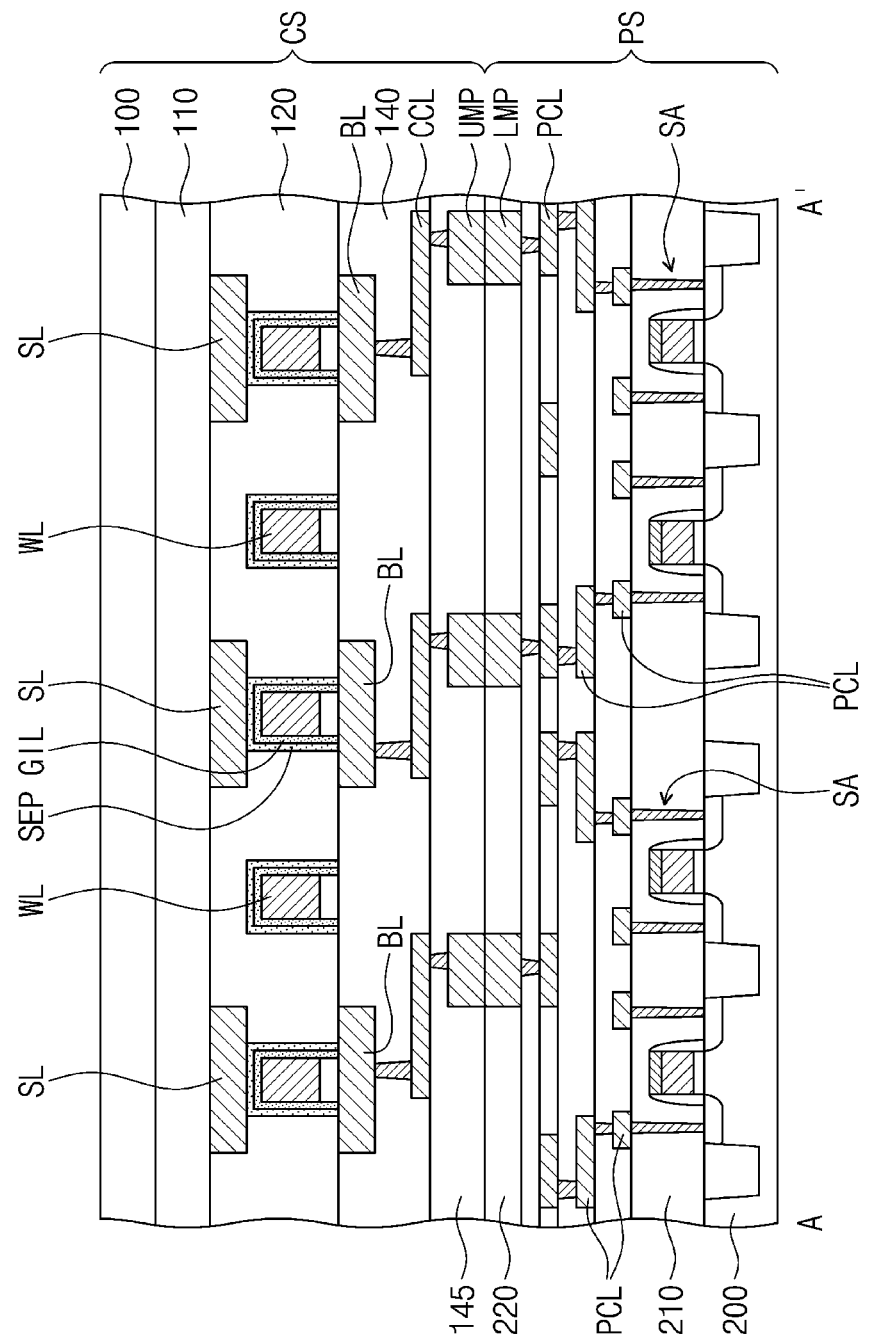

FIGS. 8, 9, and 10 illustrate cross-sectional views taken along line A-A' of FIG. 5, showing a semiconductor memory device according to some embodiments of the present inventive concepts. For brevity of explanation, a detailed description of technical features the same as those of the semiconductor memory device discussed above may be omitted, and a difference thereof will be described.

Referring to FIG. 8, a plurality of memory cell arrays MCA1 and MCA2 may be stacked on the substrate 100. For example, a second memory cell array layer MCA2 may be disposed on a first memory cell array layer MCA1. The first and second memory cell array layers MCA1 and MCA2 may have substantially the same structure.

The first memory cell array layer MCA1 may include lower word lines WLa, lower bit lines BLa, lower source lines SLa, and lower memory cells, and the lower memory cells may be disposed at intersections between the lower word lines WLa, the lower bit line BLa, and the lower source lines SLa. Each of the lower memory cells may include, as discussed above, the semiconductor pattern SEP and the gate dielectric pattern GIL.

The second memory cell array layer MCA2 may be disposed on the second interlayer dielectric layer 140 that covers the lower bit lines BLa. The second memory cell array layer MCA2 may include upper word lines WLb, upper bit lines BLb, upper source lines SLb, and upper memory cells, and the upper memory cells may be disposed at intersections between the upper word lines WLb, the upper bit lines BLb, and the upper source lines SLb. Each of the upper memory cells may include, as discussed above, the semiconductor pattern SEP and the gate dielectric pattern GIL.

On the first and second memory cell array layers MCA1 and MCA2, the lower and upper source lines SLa and SLb may extend in the third direction D3, the lower and upper word lines WLa and WLb may extend in the first direction D1, and the lower and upper bit lines BLa and BLb may extend in the second direction D2. Alternatively, as illustrated in FIG. 3, the lower and upper bit lines BLa and BLb may extend in the fifth direction D5.

Because a plurality of memory cell array layers MCA1 and MCA2 are disposed on the substrate 100, the memory cells MC may be three-dimensionally integrated to increase integration of a semiconductor memory device.

According to the embodiment shown in FIG. 9, a semiconductor memory device may include a peripheral circuit structure PS on a substrate 100 and a cell array structure CS on the peripheral circuit structure PS. The substrate 100 may include a semiconductor material.

The peripheral circuit structure PS may be disposed between the substrate 100 and a lower dielectric layer 110. The peripheral circuit structure PS may include peripheral circuits SA formed on the substrate 100, peripheral circuit dielectric layers ILD that cover the peripheral circuits SA and are stacked between the substrate 100 and the lower dielectric layer 110, and peripheral circuit lines PCL disposed in the peripheral circuit dielectric layers ILD.

The peripheral circuits SA may include the row and column decoders (see 2 and 4 of FIG. 1), the sense amplifier (see 3 of FIG. 1), and the control logic (see 5 of FIG. 1). For example, the peripheral circuits SA may include NMOS and PMOS transistors that are integrated on the substrate 100.

The peripheral circuits SA may be connected, through the peripheral circuit lines PCL and contact plugs, to word lines WL, source lines SL, and bit lines BL of the cell array structure CS which will be discussed below.

The cell array structure CS may include, as discussed in the embodiment above, the word lines WL, the source lines SL, the bit lines BL, and the memory cells MC disposed at intersections therebetween, with lines WL, SL, and BL arranged in different directions from each other.

Referring to FIG. 10, a semiconductor memory device may include a peripheral circuit structure PS including lower metal pads LMP at an uppermost layer of the peripheral circuit structure PS and a cell array structure CS including upper metal pads UMP at an uppermost layer of the cell array structure CS.

A bonding method may be employed to electrically and physically connect the upper metal pads UMP of the cell array structure CS to the lower metal pads LMP of the peripheral circuit structure PS. The lower and upper metal pads LMP and UMP may include or may be formed of a metallic material, such as copper (Cu).

For example, as discussed in the embodiment above, the cell array structure CS may include the word lines WL, the source lines SL, the bit lines BL, and the memory cells MC disposed at intersections therebetween, with lines WL, SL, and BL arranged in different directions from each other.

In some embodiments, the source lines SL may be disposed on a lower dielectric layer 110, the word lines WL may be disposed in a first interlayer dielectric layer 120, and the bit lines BL may be disposed on the first interlayer dielectric layer 120.

The first interlayer dielectric layer 120 may be provided thereon with a second interlayer dielectric layer 140 that covers the bit lines BL, and the second interlayer dielectric layer 140 may be provided therein with cell metal lines CCL that are connected through contact plugs to the bit lines BL.

A third interlayer dielectric layer 145 may be disposed on the second interlayer dielectric layer 140, and the upper metal pads UMP may be disposed in the third interlayer dielectric layer 145. The upper metal pads UMP may have their top surfaces substantially coplanar with that of the third interlayer dielectric layer 145.

The peripheral circuit structure PS may include peripheral circuits SA integrated on a substrate 200, peripheral circuit lines PCL electrically connected to the peripheral circuits SA, and lower metal pads LMP electrically connected to the peripheral circuit lines PCL. The lower metal pads LMP may be disposed on an uppermost peripheral dielectric layer 220 of the peripheral circuit structure PS. The lower metal pads LMP may have their top surfaces substantially coplanar with that of the uppermost peripheral dielectric layer 220. Terms such as "same," "equal," "planar," or "coplanar," as used herein encompass identicality or near identicality including variations that may occur, for example, due to manufacturing processes. The term "substantially" may be used herein to emphasize this meaning, unless the context or other statements indicate otherwise.

The uppermost peripheral dielectric layer 220 may be in contact with the third interlayer dielectric layer 145 disposed at an uppermost layer of the cell array structure CS. The lower metal pads LMP of the peripheral circuit structure PS may be in contact with the upper metal pads UMP of the cell array structure CS.

The lower and upper metal pads LMP and UMP may have substantially the same size and arrangement. The lower and upper metal pads LMP and UMP may include or may be formed of, for example, copper (Cu), aluminum (Al), nickel (Ni), cobalt (Co), tungsten (W), titanium (Ti), tin (Sn), or any alloy thereof.

The semiconductor memory device according to some embodiments shown in FIG. 10 may be fabricated by forming the cell array structure CS including the memory cells MC on the substrate 100 (also called a first semiconductor substrate), forming the peripheral circuit structure PS including core and peripheral circuits on the substrate 200 (also called a second semiconductor substrate) different from the first semiconductor substrate 100, and then using a bonding method to connect the first semiconductor substrate 100 to the second semiconductor substrate 200. For example, a bonding method may be employed to electrically and physically connect the lower metal pads LMP of the peripheral circuit structure PS to the upper metal pads UMP of the cell array structure CS.

According to the embodiments shown in FIGS. 9 and 10, because a cell array structure and a peripheral circuit structure can be vertically disposed on a substrate, a semiconductor memory device may increase in integration.

FIGS. 11 to 14 illustrate cross-sectional views taken along line A-A' of FIG. 5, showing a method of fabricating a semiconductor memory device according to some embodiments of the present inventive concepts.

Referring to FIGS. 5 and 11, a lower dielectric layer 110 may be formed on a substrate 100. The lower dielectric layer 110 may include or may be formed of, for example, one or more of a silicon oxide layer, a silicon nitride layer, a silicon oxynitride layer, and a high-k dielectric layer. The lower dielectric layer 110 may include a plurality of stacked dielectric layers.

Source lines SL may be formed to extend in a third direction D3 on the lower dielectric layer 110. The source lines SL may be formed by depositing a conductive layer on the lower dielectric layer 110, and then patterning the conductive layer.

Referring to FIGS. 5 and 12, a first interlayer dielectric layer 120 and an etch stop layer 121 may be sequentially formed on the source lines SL. The first interlayer dielectric layer 120 and the etch stop layer 121 may be formed by using chemical vapor deposition (CVD) or atomic layer deposition (ALD).

The first interlayer dielectric layer 120 may be formed of, for example, one or more of a silicon oxide layer, a silicon nitride layer, a silicon oxynitride layer, and a low-k dielectric layer. The etch stop layer 121 may be formed of a dielectric material having an etch selectivity with respect to the first interlayer dielectric layer 120. The etch stop layer 121 may be formed of, for example, a silicon nitride layer or a silicon oxynitride layer. The first interlayer dielectric layer 120 and the etch stop layer 121 may be patterned to form trenches T crossing the source lines SL. The formation of the trenches T may include forming a mask pattern (not shown) on the etch stop layer 121 and then using the mask pattern as an etching mask to sequentially anisotropically etch the etch stop layer 121 and the first interlayer dielectric layer 120 to expose portions of the source lines SL. The trenches T may extend in a first direction D1 and may be spaced apart from each other in a fifth direction D5.

Referring to FIGS. 5 and 13, a semiconductor layer 131, a gate dielectric layer 133, and a gate conductive layer 135 may be sequentially formed in the trenches T.

The semiconductor layer 131 may be formed by using at least one selected from physical vapor deposition (PVD), thermal chemical deposition process (thermal CVD), low pressure chemical vapor deposition (LPCVD), plasma enhanced chemical vapor deposition (PECVD), and atomic layer deposition (ALD).

The semiconductor layer 131 may have a substantially uniform thickness that covers bottom surfaces and inner walls of the trenches T. The thickness of the semiconductor layer 131 may be less than about half of a thickness of the trench T. The semiconductor layer 131 may include or may be formed of a semiconductor material, an oxide semiconductor material, or a two-dimensional semiconductor material. The semiconductor layer 131 may include or may be formed of, for example, silicon, germanium, silicon-germanium, or indium gallium zinc oxide (IGZO).

Before the formation of the gate dielectric layer 133, the semiconductor layer 131 may undergo a patterning process and thus may be spaced apart from each other in a first direction D1. When the patterning process is performed on the semiconductor layer 131, sacrificial patterns (not shown) may be used which extend in the second direction D2 and are spaced apart from each other in the first direction D1.

After the semiconductor layer 131 is patterned, the gate dielectric layer 133 and the gate conductive layer 135 may be sequentially deposited to conformally cover the patterned semiconductor layer 131. In the trenches T, the gate dielectric layer 133 may be deposited to have a uniform thickness that covers the semiconductor layer 131. The gate conductive layer 135 may fill the trenches T in which are formed the semiconductor layer 131 and the gate dielectric layer 133.

The gate dielectric layer 133 and the gate conductive layer 135 may be formed by using at least one selected from physical vapor deposition (PVD), thermal chemical deposition process (thermal CVD), low pressure chemical vapor deposition (LPCVD), plasma enhanced chemical vapor deposition (PECVD), and atomic layer deposition (ALD).

The gate dielectric layer 133 may be formed of, for example, a silicon oxide layer, a silicon oxynitride layer, a high-k dielectric layer whose dielectric constant is greater than that of a silicon oxide layer, or any combination thereof. The high-k dielectric layer may be formed of metal oxide or metal oxynitride.

The gate conductive layer 135 may be formed of, for example, doped polysilicon, metal, conductive metal nitride, conductive metal silicide, conductive metal oxide, or any combination thereof.

Referring to FIGS. 5 and 14, the gate conductive layer 135 may undergo an anisotropic etching process to form word lines WL that extend along the first direction D1 in the trenches T. When the anisotropic etching process is performed on the gate conductive layer 135, top surfaces of the word lines WL may become lower than a top surface of the first interlayer dielectric layer 120. The etch stop layer 121 may be used as an etch stopper when the gate conductive layer 135 undergoes the anisotropic etching process. Alternatively, after a planarization process is performed on the gate conductive layer 135, an etching process may be additionally executed to recess top surfaces of the word lines WL.

After the formation of the word lines WL, an anisotropic etching process may be performed on the gate dielectric layer 133 and the semiconductor layer 131. Therefore, a plurality of semiconductor patterns SEP and a gate dielectric pattern GIL may be formed in each of the trenches T.

The etch stop layer 121 may be removed to expose the top surface of the first interlayer dielectric layer 120, and a dielectric material may fill the trenches T in which are formed the semiconductor patterns SEP, the gate dielectric pattern GIL, and the word lines WL.

Afterwards, as shown in FIGS. 5, 6A, and 6B, bit lines BL may be formed to extend in the second direction D2 on the first interlayer dielectric layer 120. Alternatively, as illustrated in FIG. 3, the bit lines BL may be formed to extend in the fifth direction D5 on the first interlayer dielectric layer 120.

Ordinal numbers such as "first," "second," "third," etc. may be used simply as labels of certain elements, steps, directions, etc., to distinguish such elements, steps, directions, etc. from one another. Terms that are not described using "first," "second," "third," etc., in the specification, may still be referred to as "first" or "second" or "third," etc., in a claim. In addition, a term that is referenced with a particular ordinal number (e.g., "first" in a particular claim) may be described elsewhere with a different ordinal number (e.g., "second" in the specification or another claim).

According to some embodiments of the present inventive concepts, it may be possible to securely obtain a sensing margin when a semiconductor memory device is in a read operation, and to prevent write disturbance in which data is written at the same time to memory cells included in each row when a semiconductor memory device is in a write operation. Accordingly, a semiconductor memory device may improve in electrical properties.

Although the present inventive concepts have been described in connection with some example embodiments of the present inventive concepts illustrated in the accompanying drawings, it will be understood to those skilled in the art that various changes and modifications may be made without departing from the technical spirit and essential feature of the present inventive concepts. It will be apparent to those skilled in the art that various substitution, modifications, and changes may be thereto without departing from the scope and spirit of the present inventive concepts.

What is claimed is:

1. A semiconductor memory device, comprising:
a substrate;
a plurality of source lines extending in a first direction on the substrate;
a plurality of word lines crossing the source lines and extending in a second direction different from the first direction;
a plurality of bit lines crossing the source lines and the word lines and extending in a third direction different from the first direction and the second direction; and
a plurality of memory cells disposed at intersections between the source lines, the word lines, and the bit lines,
wherein the first, second, and third directions are parallel to a top surface of the substrate.

2. The semiconductor memory device of claim 1, wherein the word lines extend in an oblique direction relative to the source lines, and
the bit lines extend in an oblique direction relative to the word lines.

3. The semiconductor memory device of claim 1, wherein the third direction is orthogonal to the second direction, and
the first direction is oblique relative to the second and third directions.

4. The semiconductor memory device of claim 1, wherein each of the memory cells includes a semiconductor pattern including a source region, a drain region, and a channel region between the source region and the drain region.

5. The semiconductor memory device of claim 4, wherein the semiconductor pattern includes:
a plurality of vertical parts that cover opposite sidewalls of a respective word line; and
a horizontal part that connects the vertical parts to each other and is in contact with a respective source line.

6. The semiconductor memory device of claim 5, further comprising a gate dielectric pattern between the respective word line and the semiconductor pattern.

7. The semiconductor memory device of claim 6, further comprising a data storage pattern between the semiconductor pattern and the gate dielectric pattern.

8. The semiconductor memory device of claim 5, wherein the vertical parts of the semiconductor pattern are perpendicular to the top surface of the substrate.

9. The semiconductor memory device of claim 5, wherein the vertical parts of the semiconductor pattern are connected in common to a respective bit line.

10. A semiconductor memory device, comprising:
a substrate;
a plurality of source lines extending in a first direction on the substrate;
a plurality of word lines crossing the source lines and extending in a second direction different from the first direction;
a plurality of bit lines crossing the source lines and the word lines and extending in a third direction different from the first direction and the second direction; and
a plurality of memory cells disposed at intersections between the source lines, the word lines, and the bit lines, wherein each of the memory cells includes a semiconductor pattern including a source region, a drain region, and a channel region between the source region and the drain region, wherein the first, second, and third directions are parallel to a top surface of the substrate, and wherein the channel region of the semiconductor pattern extends in a fourth direction perpendicular to the top surface of the substrate.

11. The semiconductor memory device of claim 10, wherein the source region of the semiconductor pattern is in contact with a portion of the source lines, and the drain region of the semiconductor pattern is in contact with a portion of the bit lines.

12. The semiconductor memory device of claim 10, wherein the semiconductor patterns of the memory cells are arranged along the second direction.

13. The semiconductor memory device of claim 10, wherein the semiconductor pattern includes:

a plurality of vertical parts that cover opposite sidewalls of a respective word line; and a horizontal part that connects the vertical parts to each other and is in contact with a respective source line.

14. The semiconductor memory device of claim 10, wherein, in the fourth direction, the word lines are arranged between the source lines and the bit lines.

15. The semiconductor memory device of claim 10, further comprising a gate dielectric pattern between the word lines and the semiconductor patterns of the memory cells.

16. The semiconductor memory device of claim 15, further comprising a data storage pattern between the gate dielectric pattern and the word lines.

17. The semiconductor memory device of claim 16, wherein the data storage pattern includes a ferroelectric material.

18. A semiconductor memory device, comprising:

a substrate;

a source line extending in a first direction on the substrate;

an interlayer dielectric layer having a trench that extends in a second direction crossing the source line, the second direction being different from the first direction;

a semiconductor pattern disposed in the trench, the semiconductor pattern defining a gap region;

a word line disposed in the gap region of the semiconductor pattern;

a gate dielectric pattern disposed between the word line and the semiconductor pattern; and a bit line disposed on the interlayer dielectric layer, the bit line extending in a third direction different from the second direction, wherein the bit line is vertically spaced apart from the word line and is in contact with the semiconductor pattern.

19. The semiconductor memory device of claim 18, wherein the semiconductor pattern includes:

a plurality of vertical parts that cover opposite sidewalls of the word line; and a horizontal part that connects the vertical parts to each other and is in contact with the source line.

20. The semiconductor memory device of claim 19, wherein the vertical parts of the semiconductor pattern are connected in common to a portion of the bit line.

* * * * *